United States Patent
Takahashi et al.

(10) Patent No.: US 6,544,664 B1
(45) Date of Patent: Apr. 8, 2003

(54) COPPER FOIL FOR PRINTED WIRING BOARD

(75) Inventors: Naotomi Takahashi, Saitama (JP); Yoichi Babasaki, Saitama (JP); Tsutomu Higuchi, Saitama (JP); Osamu Nakano, Saitama (JP); Hiroshi Watanabe, Saitama (JP); Masaru Takahashi, Saitama (JP); Makoto Dobashi, Saitama (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 09/577,958

(22) Filed: May 24, 2000

(30) Foreign Application Priority Data

May 25, 1999  (JP) ............................................. 11-145620

(51) Int. Cl.$^7$ .......................... B32B 15/00; B32B 15/20; B32B 15/04
(52) U.S. Cl. ......................... 428/607; 428/666; 428/674; 428/336; 204/192.1
(58) Field of Search ................................. 428/607, 615, 428/666, 671, 674, 675, 676, 687, 213, 214, 215, 332, 336, 457, 901, 938; 427/585, 455, 96, 99, 250; 204/192.1, 192.15; 174/250, 255, 256

(56) References Cited

U.S. PATENT DOCUMENTS

| | | | | |
|---|---|---|---|---|
| 3,625,844 A | * | 12/1971 | McKean ...................... 204/140 |
| 3,857,681 A | | 12/1974 | Yates et al. .................... 29/195 |
| 4,455,181 A | * | 6/1984 | Lifshin et al. ............... 156/150 |
| 4,863,808 A | * | 9/1989 | Sallo ........................... 428/601 |
| 5,017,271 A | * | 5/1991 | Whewell et al. .............. 204/15 |
| 5,128,008 A | * | 7/1992 | Chen et al. ............. 204/192.15 |
| 5,304,847 A | * | 4/1994 | Neugebauer et al. ........ 257/762 |
| 5,431,803 A | | 7/1995 | DiFranco et al. .............. 205/50 |
| 5,573,845 A | | 11/1996 | Parthasarathi et al. ... 428/306.6 |
| 5,709,957 A | * | 1/1998 | Chiang et al. ............... 428/615 |
| 5,863,666 A | * | 1/1999 | Merchant et al. ............ 428/544 |
| 6,238,778 B1 | * | 5/2001 | Schneider .................... 428/209 |
| 6,245,432 B1 | * | 6/2001 | Funada et al. ............... 428/458 |
| 6,268,070 B1 | * | 7/2001 | Bergstresser et al. ........ 428/622 |
| 6,270,889 B1 | * | 8/2001 | Kataoka et al. .............. 428/352 |
| 6,319,620 B1 | * | 11/2001 | Kataoka et al. .............. 428/626 |
| 6,346,335 B1 | * | 2/2002 | Chen et al. .................. 428/629 |

FOREIGN PATENT DOCUMENTS

| | | | |
|---|---|---|---|
| EP | 00 11 0287 | 7/2001 | ............. H05K/3/38 |
| JP | 2-238696 | 9/1990 | ............. H05K/3/38 |
| JP | 4-284690 | 10/1992 | ............. H05K/3/38 |
| JP | 5-167243 | 7/1993 | ............. H05K/3/38 |
| JP | 5-235542 | 9/1993 | ............. H05K/3/38 |
| JP | 7-188969 | 7/1995 | ............. H05K/3/38 |

\* cited by examiner

Primary Examiner—Deborah Jones
Assistant Examiner—Michael La Villa
(74) Attorney, Agent, or Firm—Jenkens & Gilchrist

(57) ABSTRACT

A copper foil for use in making a printed wiring board and a copper clad laminate comprising the copper foil are herein disclosed and the copper foil is characterized in that a metal chromium layer is formed on at least one side of the copper foil by vapor deposition or characterized in that one side of the copper foil is supported by a carrier through a releasing layer and a metal chromium layer is formed on the other side of the foil by vapor deposition. The copper foil is excellent in the adhesion to various substrates (the peel strength between the substrate and the copper foil), moisture resistance, chemical resistance and heat resistance and therefore, the copper foil can suitably be used in the production of printed wiring boards.

4 Claims, No Drawings

COPPER FOIL FOR PRINTED WIRING BOARD

BACKGROUND OF THE INVENTION (a) Field of the Invention

The present invention relates to a copper foil for making a printed wiring board and a copper clad laminate and more specifically to a copper foil for making a printed wiring board, which is excellent in the adhesion to a base material (substrate) such as a glass-epoxy resin substrate, a polyester resin substrate, a polyimide resin substrate or an aramid substrate (or peel strength between a substrate and the copper foil), moisture resistance, chemical resistance and heat resistance and a copper clad laminate comprising the copper foil and a substrate.

(b) Description of the Prior Art

When using a copper foil for making a printed wiring board, the copper foil is in general adhered to and laminated with a substrate such as a glass-epoxy resin substrate, a polyester resin substrate, a polyimide resin substrate or an aramid substrate, while applying heat and pressure thereto to form a copper clad laminate, then an etching resist is applied to the surface of the foil by the photo imaging process using a resist and a desired wiring pattern is formed by etching with an etchant.

In respect of the quality and characteristic properties, the copper foil for printed wiring boards should satisfy such requirements as high adhesion to a substrate (or high peel strength between the substrate and the copper foil), and high moisture resistance, chemical resistance and heat resistance. This is because the copper foil must withstand the influence of moisture, chemicals and heat, to which the foil is exposed or encountered in the manufacturing process, for instance, during the formation of an etching resist and during packaging such circuit components.

Methods for imparting the foregoing characteristic properties to the copper foil for printed wiring boards are disclosed in, for instance, Japanese Un-Examined Patent Publication Nos. Hei 2-238696, Hei 4-284690, Hei 5-167243, Hei 5-235542 and Hei 7-188969 and comprise the step of, for instance, forming a layer of a metal or an alloy such as tin, chromium, copper, iron, cobalt, zinc and nickel on the surface of a copper foil for printed wiring boards by a wet method such as electroless plating or electro-plating.

As has been discussed above, when a layer of a metal or an alloy is formed on the surface of a copper foil for use in making a printed wiring board, such a wet method as the electroless plating or electro-plating technique is insufficient in the uniformity of electrodeposition and therefore, it is difficult to control the thickness of the resulting layer or film. More specifically, a large number of pinholes are formed on a quite thin metal or alloy layer having a thickness of not more than 500 nm and the underlying copper is sometimes partially exposed or the layer may contain inclusions. Thus, the resulting printed wiring board is not always sufficient in the adhesion to a substrate (or the peel strength between the substrate and the copper foil), moisture resistance, chemical resistance and heat resistance. Moreover, the base material such as a resin is sometimes deteriorated at the portion, in which the resin is adhered to the exposed copper foil. These problems may be eliminated to some extent by increasing the thickness of the metal or alloy layer, but another problem concerning productivity arises. More specifically, it takes a longer time to form such a layer as the thickness thereof increases and this correspondingly leads to an increase in the time required for etching the resulting layer. In addition, when forming a metal chromium layer by the wet method, a problem arises, which concerns environmental pollution with, for instance, $Cr^{6+}$, $Cr^{3+}$ and a mist.

BRIEF SUMMARY OF THE INVENTION

Accordingly, it is an object of the present invention to provide a copper foil for use in making a printed wiring board, which is improved in the adhesion to a substrate such as a glass-epoxy resin substrate, polyester resin substrate, polyimide resin substrate or aramid resin substrate (or the peel strength between the substrate and the copper foil), moisture resistance, chemical resistance and heat resistance, by forming, on the surface of the copper foil, a thin chromium layer which has a uniform thickness and which is free of any pinhole (or free of any pore) and any partial exposure of the copper surface.

It is another object of the present invention to provide a copper clad laminate comprising the copper foil and a substrate.

The inventors of this invention have variously investigated methods for forming a metal chromium layer on the surface of a copper foil for printed wiring boards as well as the quality and characteristics of the resulting copper foil, have found that the foregoing object of the present invention can be accomplished by forming a metal chromium layer on the surface of a copper foil for making a printed wiring board according to the vapor deposition technique and have thus completed the present invention.

According to an aspect of the present invention, there is provided a copper foil for use in making a printed wiring board, which comprises a metal chromium layer formed on one or both sides of the foil by vapor deposition, for instance, a metal chromium layer which is vapor deposited by the sputtering method.

In the copper foil for use in making a printed wiring board according to the present invention, the metal chromium layer preferably has a uniform thickness falling within the range of from 5 to 500 nm and is free of any pore. More preferably the metal chromium layer has a uniform thickness ranging from 5 to 50 nm and is free of any pore and translucent.

According to another aspect of the present invention, there is also provided a copper foil for use in making a printed wiring board, which is equipped with a carrier. The copper foil is characterized in that one side of the copper foil is supported on the carrier through a releasing layer and that it comprises, on the other side, a metal chromium layer formed by vapor deposition, for instance, a metal chromium layer which is vapor deposited by the sputtering method.

According to further aspect of the present invention, there is also provided a copper clad laminate comprising the copper foil and a substrate.

DETAILED DESCRIPTION OF THE INVENTION

The copper foil for printed wiring boards and the copper clad laminate according to the present invention will hereunder be described in more detail.

Copper foils usable in the present invention for the preparation of a copper foil for use in making a printed wiring board may be any one insofar as they can be used as copper foils for printed wiring boards and include, for instance, electrolytic copper foils or rolled copper foils.

Moreover, the thickness of the copper foils is not restricted to any specific range inasmuch as the use thereof does not adversely affect the desired quality and characteristics of the resulting printed wiring boards. For instance, the thickness thereof ranges from about 0.5 to 100 μm.

In the present invention, the metal chromium layer may be applied onto one or both sides of the copper foil depending on the shape (single layer, multi-layer or the like) of the printed wiring board formed from the copper foil and the rust-proofing properties thereof during storage. In addition, the copper foil may or may not be subjected to a surface-roughening treatment commonly adopted for this purpose. If an electrolytic copper foil is used and a metal chromium layer is applied to one side thereof, the side thereof to which the metal chromium layer is applied may be the S face (the shiny face; the face pealed from the drum surface) or the M face (the matted face; the face opposite to the S face). In short, it is important to apply a metal chromium layer at least to the face, which is to be laminated with a base material (or substrate).

In the copper foil for printed wiring boards in which one side thereof is supported by a carrier through a releasing layer and a metal chromium layer is formed on the opposite face by sputtering, such a carrier may be either a copper foil or a plastic film. In addition, the releasing layer may be formed from any material, which can be used for preparing releasing layer, such as an organic layer or a metal oxide.

The copper foil for use in making a printed wiring board can be prepared by applying a metal chromium layer onto at least one side of a copper foil by vapor deposition. In this respect, the vapor deposition method may be selected from, for instance, sputtering and vacuum deposition methods. The sputtering method may be any one and examples thereof are DC sputtering, RF sputtering and magnetron sputtering techniques. These sputtering techniques may be carried out under the usual conditions.

The shape of target to be used is not restricted to any specific one insofar as they are made of metal chromium. In short, the shape of target may be changed depending on the sputtering device used.

The copper foil for printed wiring boards according to the present invention, which is prepared by the foregoing method, is covered with a metal chromium layer formed, on at least one side thereof, by such a sputtering technique, except for a portion with a sharp and deep incision such as that in the copper foil on which a pinhole is formed and the shady side, with respect to the target, such as the shady side of an overhanging portion formed by a surface-roughening treatment. Correspondingly, the metal chromium layer has a uniform thickness on the side facing the target. Thus, the metal chromium layer is free of any pore except for the foregoing portions such as those with sharp and deep incisions and the shady sides of, for instance, overhangs and completely covers the surface of the copper foil and can ensure the elimination of any exposed copper surface.

According to the present invention, the copper foil for printed wiring boards can be improved in the moisture resistance, chemical resistance and heat resistance by increasing the thickness of the metal chromium layer. If the thickness thereof exceeds 500 nm, however, the improvement of the copper foil in the foregoing properties cannot be expected any more, while only the production cost increases. On the other hand, if the metal chromium layer is thin, the production line can be operated at a high speed and this results in the improvement of the productivity. However, if the thickness of the metal chromium layer is less than 5 nm, it would be quite difficult to form a layer free of any pore and this would make the moisture resistance, chemical resistance and heat resistance insufficient. If the thickness of the layer is set to about 5 to 50 nm, the resulting layer is translucent.

Accordingly, in the copper foil for printed wiring boards of the present invention, the metal chromium layer preferably has a uniform thickness falling within the range of from 5 to 500 nm and is free of any pore. More preferably, the metal chromium layer has a uniform thickness ranging from 5 to 50 nm and is free of any pore and translucent. In the present invention, the term "uniform thickness" means the thickness which can be controlled within an error range of ±5% and the term "translucent" means the condition in which the layer permits the transmission of not less than 10% and less than 100% of the incident light rays and is used to denote a film free of any pore.

Alternatively, according to another embodiment of the copper foil for printed wiring boards of the present invention, which is prepared by the foregoing method, one side of the copper foil is supported by a carrier through a releasing layer, while the other side thereof is provided thereon with a metal chromium layer formed by sputtering and the metal chromium layer possesses the quality and characteristic properties such as those discussed above.

The copper foil for printed wiring boards according to the present invention possesses the foregoing quality and characteristic properties and therefore, it is improved in the adhesion to a substrate such as a glass-epoxy resin substrate, polyester resin substrate, polyimide resin substrate or aramid resin substrate (peel strength between the copper foil and the substrate), moisture resistance, chemical resistance and heat resistance. In addition, the metal chromium layer can maintain the foregoing quality and characteristics even if the thickness thereof is reduced and therefore, this makes the etching thereof easy.

The copper clad laminate according to the present invention can be made by a process in which said copper foil was adhered to and laminated with a substrate, while heating the assembly and applying a pressure to the assembly to form a copper clad laminate.

The present invention will hereunder be described in more detail with reference to the following working Examples, but the present invention is not restricted to these Specific Examples at all.

EXAMPLE 1

An electrolytic copper foil having a width of 1300 mm and a thickness of 9 μm with nodular treatment was used in this example. Moreover, there were used a winding up type sputtering device SPW-155 available from ULVAC JAPAN, Ltd. and two chromium targets each having a size of 300 mm×1700 mm as targets for the sputtering device.

The following sputtering conditions were used in this Example:

Ultimate Vacuum, Pu: less than $1 \times 10^{-4}$ Pa

Sputtering Pressure, Par: 0.4 Pa

Electric Power for Sputtering: 51 kWDC per machine; 2 machines

Taking up Speed: 8 m/min

The thickness of the metal chromium layer formed on the copper foil surface under the foregoing sputtering conditions was determined as follows: a plurality of samples for observing the cross section were prepared for every right, central and left regions in the transverse direction of the copper foil having a width of 1300 mm using an ultramicrotome and the cross section of each sample was examined by a transmission electron microscope H-9000NAR available from Hitachi, Ltd. at an acceleration voltage of 300 kV. As a result, it was found that all of the samples had a thickness of about 50 nm within an error range of ±5%. Moreover, the throughput capacity was found to be 624 m$^2$/hr in this case.

The M and S faces of the electrolytic copper foil were separately subjected to the foregoing operations. The copper foil for printed wiring boards according to the present invention thus prepared was adhered to and laminated with a base material of a glass-epoxy resin substrate (FR-4) for 60 minutes, while heating the assembly to 170° C. and applying a pressure of 30 kgf/cm$^2$ to the assembly to form a copper clad laminate. As a result, the peel strength between the base material and the electrolytic copper foil (the M face side or the S face side (provided thereon with the metal chromium layer)) after copper plating up to 35 μm was found to be as follows:

1.6±0.1 kgf/cm: for the side of the M face;

1.2±0.1 kgf/cm: for the side of the S face.

EXAMPLE 2

An electrolytic copper foil having a width of 1300 mm and a thickness of 9 μm with nodular treatment was used in this example. Moreover, there were used a winding up type sputtering device SPW-155 available from ULVAC JAPAN, Ltd. and two chromium targets each having a size of 300 mm×1700 mm as targets for the sputt ering device.

The following sputtering conditions were used in this Example:

Ultimate Vacuum, Pu: less than 1×10$^{-4}$ Pa

Sputtering Pressure, Par: 0.4 Pa

Electric Power for Sputtering: 51 KWDC per machine; 2 machines

Taking up Speed: 2 m/min

A metal chromium layer having a thickness of 200 nm was formed on the side of the M face of the electrolytic copper foil under the foregoing conditions.

The copper foil for printed wiring boards according to the present invention thus prepared was adhered to and laminated with a base material of a glass-epoxy resin substrate (FR-4) for 60 minutes, while heating the assembly to 170° C. and applying a pressure of 30 kgf/cm$^2$ to the assembly to form a copper clad laminate. After copper plating up to 35 μm, an etching resist having a width of 0.8 mm was formed by photo imaging process, followed by etching with an etchant.

The resulting printed wiring board was inspected for the general characteristic properties, i.e., moisture resistance, chemical resistance and heat resistance, according to the following methods:

Moisture Resistance:

The printed wiring board was boiled in water for 2 hours and then the porcentage deterioration of the peel strength was determined. The moisture resistance was evaluated in terms of the porcentage deterioration of the peel strength. The porcentage was found to be 2.0%.

Resistance to Hydrochloric Acid:

The printed wiring board was immersed in a 12% HCl aqueous solution for 30 minutes and then the porcentage deterioration of the peel strength was determined. The resistance to hydrochloric acid was evaluated in terms of the porcentage deterioration of the peel strength. In this case, the porcentage was found to be 0.5%.

Heat Resistance:

The printed wiring board was humidified, then immersed in a molten solder and inspected for the presence of any blister. However, any blister was not observed on the board.

Comparative Example 1

An electrolytic copper foil having a width of 1300 mm and a thickness of 9 μm with nodular treatment was plated with a chromium layer having a thickness of 200 nm at a current density of 30 A/dm$^2$ using a Sargent bath having the following bath composition: 250 g/l of anhydrous chromic acid and 2.5 g/l of sulfuric acid. The resulting chromium-plated copper foil was laminated with and adhered to a glass-epoxy resin substrate (FR-4) for 60 minutes, while heating the assembly to 170° C. and applying a pressure of 30 kgf/cm$^2$ to the assembly to form a copper clad laminate. After copper plating up to 35 μm, an etching resist having a width of 0.8 mm was formed by photo imaging process, followed by etching with an etchant.

The resulting printed wiring board was inspected for the moisture resistance, chemical resistance (resistance to hydrochloric acid) and heat resistance as the general characteristics thereof according to the same procedures used in Example 2. As a result, the following results were obtained:

Moisture Resistance:

The porcentage deterioration of the peel strength was found to be 9%.

Resistance to hydrochloric Acid:

The porcentage deterioration of the peel strength was found to be 4%.

Heat Resistance:

There were observed some blisters on a part of the board surface.

EXAMPLE 3

An electrolytic copper foil having a width of 1300 mm and a thickness of 9 μm with nodular treatment was used in this example. Moreover, there were used a winding up type sputtering device SPW-155 available from ULVAC JAPAN, Ltd. and two chromium targets each having a size of 300 mm×1700 mm as targets for the sputtering device.

The following sputtering conditions were used in this example:

Ultimate Vacuum, Pu: less than 1×10$^{-4}$ Pa

Sputtering Pressure, Par: 0.4 Pa

Electric Power for Sputtering: 51 kWDC per machine; 2 machines

Taking up Speed: 8 m/min

A metal chromium layer having a thickness of 50 nm was formed on the copper foil surface under the foregoing sputtering conditions.

The M and S faces of an electrolytic copper foil were separately subjected to the foregoing operations. The copper foil for printed wiring boards according to the present invention thus prepared was adhered to and laminated with a base material of a glass-epoxy resin substrate (FR-4) for 60 minutes, while heating the assembly to 200° C. and applying a pressure of 30 kgf/cm$^2$ to the assembly to form a copper clad laminate. As a result, the peel strength between the base material and the electrolytic copper foil after copper plating up to 35 μm(the M face side or the S face side (provided thereon with the metal chromium layer)) was found to be as follows:

1.4±0.1 kgf/cm: for the side of the M face;

1.0±0.1 kgf/cm: for the side of the S face.

As has been discussed above in detail, the copper foil for use in making a printed wiring board according to the present invention is excellent in the adhesion to a substrate such as a glass-epoxy resin substrate, polyester resin substrate, polyimide resin substrate or aramid resin substrate (the peel strength between the substrate and the copper foil), moisture resistance, chemical resistance and heat resistance and therefore, the copper foil can suitably be used in the production of printed wiring boards.

What is claimed is:

1. A copper foil for use in making a printed wiring board, provided with a carrier, characterized in that one side of the copper foil is supported by a carrier through a releasing layer and a metal chromium layer for laminating to a substrate is formed on the other side of the foil by vapor deposition to improve adhesion of said copper foil to said substrate, wherein said chromium layer has a uniform thickness ranging from 5 to 50 nm and is free of any pores and is translucent.

2. The copper foil for use in making a printed wiring board, provided with a carrier as set forth in claim 1 wherein one side of the copper foil is supported by a carrier through a releasing layer and said vapor-deposited metal chromium layer is formed on the other side of the foil by sputtering.

3. A copper clad laminate comprising a copper foil laminated to a substrate, said copper foil having a chromium metal layer formed by vapor deposition on the side adjacent said substrate, said copper foil being supported by a carrier and having a release layer disposed between said copper foil and said carrier, wherein said chromium layer has a uniform thickness ranging from 5 to 50 nm and is free of any pores and is translucent.

4. A copper clad laminate of claim 3 wherein said chromium metal layer is formed by sputtering.

* * * * *